United States Patent [19]
Hierold

[11] Patent Number: 5,830,372
[45] Date of Patent: *Nov. 3, 1998

[54] THERMAL SENSOR/ACTUATOR IN SEMICONDUCTOR MATERIAL

[75] Inventor: Christofer Hierold, Munich, Germany

[73] Assignee: Siemens Aktiengesellschaft, Munich, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 732,885

[22] Filed: Oct. 17, 1996

Related U.S. Application Data

[62] Division of Ser. No. 442,511, May 16, 1995, Pat. No. 5,596,219.

[30] Foreign Application Priority Data

May 25, 1994 [DE] Germany ............................ 4418207.4

[51] Int. Cl.⁶ .................................................. H01L 21/302
[52] U.S. Cl. .................................. 216/2; 216/56; 438/54
[58] Field of Search .................................. 216/2, 11, 17, 216/39, 56; 437/228; 438/53, 54

[56] References Cited

U.S. PATENT DOCUMENTS

| | | |
|---|---|---|
| 4,665,610 | 5/1987 | Barth ........................................ 29/580 |
| 4,744,863 | 5/1988 | Guckel et al. ........................ 156/653.1 |
| 4,838,088 | 6/1989 | Murakami .................... 73/724 |
| 5,179,499 | 1/1993 | MacDonald et al. ........................ 216/2 |
| 5,220,188 | 6/1993 | Higashi et al. .............................. 216/2 |
| 5,220,189 | 6/1993 | Higashi et al. .............................. 216/2 |
| 5,242,863 | 9/1993 | Xiang-Zheng et al. ................ 437/228 |
| 5,316,619 | 5/1994 | Mastrangelo .......................... 156/644.1 |
| 5,393,375 | 2/1995 | MacDonald et al. ...................... 216/46 |
| 5,493,177 | 2/1996 | Muller et al. ............................ 313/578 |
| 5,532,187 | 7/1996 | Schreiber-Prillwitz et al. ........ 437/213 |
| 5,554,304 | 9/1996 | Suzuki ......................................... 216/2 |
| 5,576,250 | 11/1996 | Diem et al. ............................... 438/53 |
| 5,620,931 | 4/1997 | Tsang et al. ................................. 216/2 |

OTHER PUBLICATIONS

Burns, D.W. et al "Thin films for micromechanical sensors" J. Vac. Sci. Technol. A 8 (4) pp. 3606–3613, Jul. 1990.

*Primary Examiner*—R. Bruce Breneman
*Assistant Examiner*—Anita Alanko
*Attorney, Agent, or Firm*—Hill & Simpson

[57] ABSTRACT

Semiconductor component with monolithically integrated electronic circuits and monolithically integrated sensor/actuator, whereby the sensor/actuator is manufactured with methods of surface micromachining in a sensor layer (3) of polysilicon that is structured, for example, with sensor webs (6), and these sensor webs (6) are thermally insulated from a silicon substrate (1) by a cavity (4) that is produced in a sacrificial layer (2) and is closed gas-tight toward the outside with a closure layer (5).

6 Claims, 3 Drawing Sheets

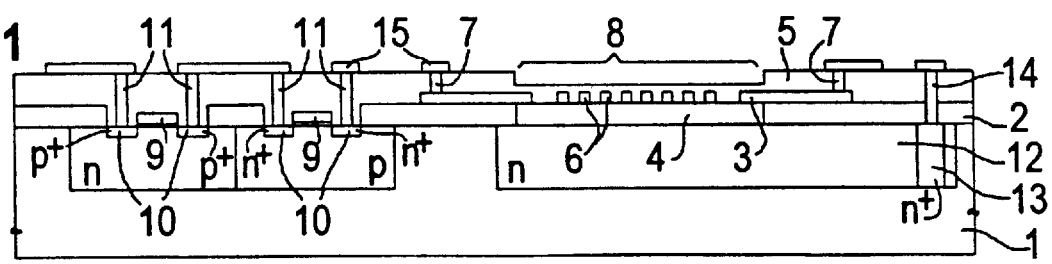
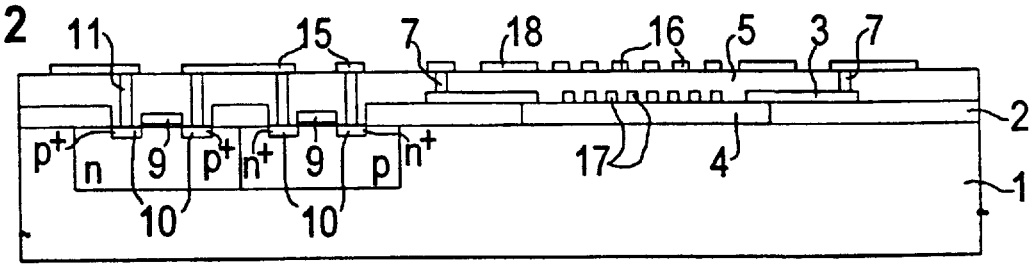
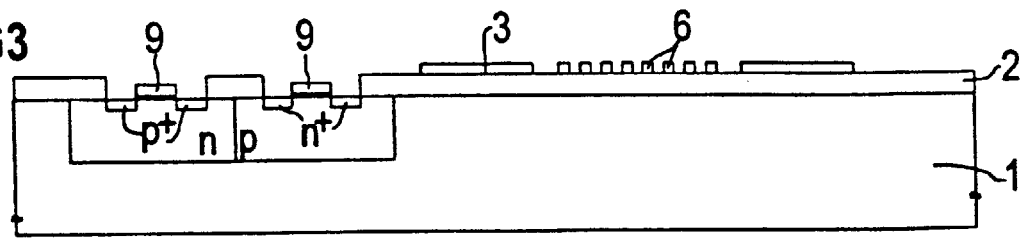

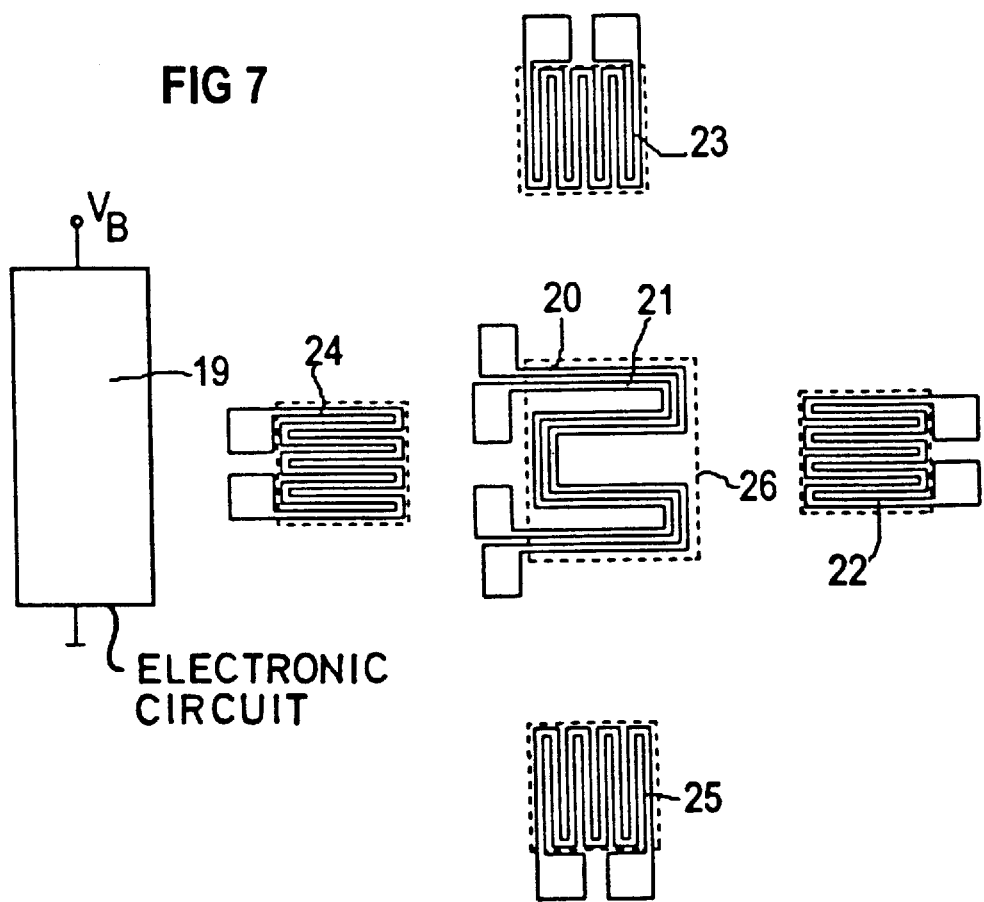

THERMAL SENSOR/ACTUATOR IN SEMICONDUCTOR MATERIAL

This is a division of application Ser. No. 08/442,511, filed May 16, 1995, now U.S. Pat. No. 5,596,219.

BACKGROUND OF THE INVENTION

The present invention is directed to a semiconductor component, particularly of silicon, with a sensor or actuator monolithically integrated therein.

The monolithic integration of a thermal sensor together with electronic circuits for the drive or, respectively, evaluation on a silicon wafer and the simultaneous manufacture of the integrated components in a standard process yields considerable advantages with respect to functional properties, dependability, miniaturization and simplification of the manufacture of these components. Thermal sensor such as, for example, temperature sensors, thermal mass flow sensors and thermal radiation sensors and actuators such as, for example, heating elements must be optimally thermally insulated from the substrate of the component in order to minimize both the heat capacity as well as the thermal conductivity to the substrate. This is necessary in order to minimize the response time of the sensor elements and to maximize the sensitivity thereof. Moreover, the quantity of heat required for a specific temperature difference should be reduced.

Previous proposals for the thermal insulation of sensors in semiconductor components with circuits monolithically integrated therein make use of methods of bulk micromachining. A gas flow sensor wherein aluminum-polysilicon thermocouples utilizing the Seebeck effect are integrated together with CMOS circuits are disclosed in the publication by D. Moser et al., "Silicon Gas Flow Sensors Using Industrial CMOS and Bipolar IC Technology" in Sensors and Actuators A,25–27, 577–581 (1991). In the manufacture of this component, the silicon substrate is removed selectively relative to the sensor layers with an anisotropic etching from the front side. Deep holes or trenches arise in the silicon substrate as a result thereof. Given the mass flow sensor disclosed in the publication by E. Yoon et al., "An Integrated Mass Flow Sensor with On-Chip CMOS Interface Circuitry" in IEEE Trans. on Electr. Dev. 39, 1376–1386 (1992), the substrate is etched out proceeding from the back side. The thermal sensors then lie on a membrane of, for example, oxide or silicon nitride on the chip surface and are then thermally coupled to the substrate only via this membrane. Special mounting techniques are required due to the structuring of the back side.

When etching from the front side, the sensor elements are usually realized as bridges or cantilevers that span the etched holes or recesses or, respectively, project into these. The thermal insulation of the sensors ensues via the surrounding medium (for example, nitrogen) and the usually thin suspensions of the bridges or cantilevers. The deep holes or trenches in the substrate can be very easily contaminated by particles. These particles, for example, are entrained by the gas flow in flow-through sensors.

SUMMARY OF THE INVENTION

It is an object of the present invention to provide a semiconductor component having an integrated thermal sensor or actuator wherein the thermal insulation of the sensor or actuator ensues in an improved manner and whereby a manufacturing method pertaining thereto is compatible with the manufacturing process of monolithically integrated electronic circuits. It is also an object of the present invention to provide such a manufacturing method.

In general terms the present invention is a thermal sensor/actuator, comprising: a semiconductor material; a structured layer that forms a sensor/actuator on a surface of the semiconductor material; a cavity in the semiconductor material that thermally insulates the structured layer from remaining semiconductor material; and a closure layer that seals said cavity toward the outside.

Advantageous developments of the present invention are as follows.

The structured layer is embedded into the closure layer.

The structured layer is predominately formed by polysilicon.

The structured layer has electrical conductors. An electrically conductive doped region is present at a side of the cavity lying opposite the closure layer. The doped region is electrically conductively connected to a contact. The structured layer and the closure layer are elastically structured over the cavity such that a change occurs in the electrical capacitance between the structured layer and the doped region in response to change in external pressure.

The cavity is located in a recess of a separate layer in the semiconductor material that is separate from the structured layer. The separate layer is a dielectric layer.

A metallization is present on that side of the closure layer facing away from the cavity. The metallization has interconnects, the interconnects being electrically insulated from the structured layer and being structured such that they are operable as a sensor/actuator.

The semiconductor component is monolithically integrated with further semiconductor components for electrical drive of the sensor/actuator.

The sensor/actuator has separate first and second portions, the first portion being operated as a sensor and the second portion being operated as a heater. The sensor and the heater are arranged in close proximity to one another such that a temperature measurable by the sensor is settable with the heater.

The sensor/actuator is part of an array of sensors/actuators that are separated from one another.

A method for the manufacture of the sensor/actuator semiconductor has the following steps. In a first step, a structure of semiconductor material is produced that forms a sensor/actuator on a substrate of semiconductor material. In a second step, a structured layer provided for a sensor/actuator is produced such that the structured layer is interrupted in a layer plane of the structured layer by interspaces. In a third step, a recess is produced under the structured layer using the interspaces. In a fourth step, a closure layer is deposited, that seals said interspaces such that a cavity remains in the recess, at a low gas pressure that is a function of the cavity to be produced. In a fifth step, contacts are produced for electrical connection of the sensor/actuator.

Advantageous developments of the method of the present invention are as follows. A sacrificial layer is applied surface-wide between the first and second steps and the recess is produced in this sacrificial layer in the third step.

The structured layer provided for the sensor/actuator is produced in the second step by surface micromachining.

In the second step, the structured layer is produced with interspaces that have a dimension less than or equal to 2 μm in all directions proceeding in the plane of the structured layer.

Given the inventive thermal sensor, the manufacture of the sensor ensues in a surface layer of a component that is preferably manufactured on silicon, said surface layer being capable of being processed with methods of surface micromachining. The structure forming the sensor is located in a layer-like region and is thermally insulated from the rest of the semiconductor material of the component by a cavity in an intermediate layer that functions as a sacrificial layer. This cavity is externally sealed by a closure layer into which the layer-like region is embedded. A description of various embodiments of this component as well as of the manufacturing method shall follow.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several figures of which like reference numerals identify like elements, and in which:

FIG. 1 shows a cross-section through a component of the present invention;

FIG. 2 shows a cross-section through an alternative embodiment of the component of the present invention;

FIGS. 3–6 show intermediate stages in the manufacture of an inventive component in cross-section of a third embodiment of the present invention; and FIG. 7 shows a schematic view onto an inventive mass flow sensor.

DESCRIPTION OF THE PREFERRED EMBODIMENTS

Figure 4:
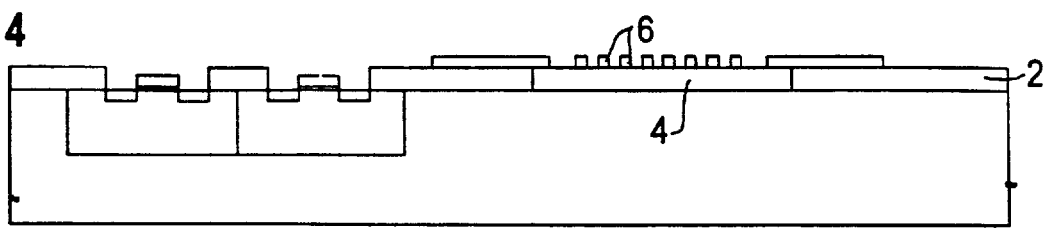

FIG. 1 shows a component wherein a sacrificial layer 2 provided for the manufacture of the cavity 4 and a sensor layer 3 are applied on a substrate. The cavity 4 is sealed by a closure layer 5. Sensor webs or ridges 6 as a constituent part of the sensor layer 3 are present over the cavity 4 in the sensor region 8. The sensor webs 6 are electrically conductively connected to one another and to contacts 7 applied on the terminal pads of the sensor layer 3. The sensor webs 6 are embedded into the closure layer 5 and span the cavity 4, and it is either only one end that rests on the sacrificial layer 2 (cantilever) or both ends of the sensor webs 6 that lie on the edges of the sacrificial layer 2 (bridges). The structuring of the sensor layer 3 is only recited here as an example. The sensor is generally fashioned as a structured layer above the cavity 4. This structured layer has, for example, the webs shown in FIG. 1 of an electrically conductive material having temperature-dependent ohmic resistance or thermocouples. Instead or additionally, this structured layer can have active components such as diodes or transistors that function as heaters or sensors.

Further components, especially active components with which, for example, the drive and evaluation circuits are constructed can be monolithically integrated in the substrate 1. Two complementary MOS transistors are present in the example shown in FIG. 1. Source and drain regions 10 are implanted in doped regions (n-well and p-well) provided for transistors that are complementary to one another. A respective gate electrode 9 of, for example, polysilicon is located therebetween on an oxide layer. The gate electrodes 9 are laterally contacted. The contacts 11 for source and drain are entered in FIG. 1. A metallization 15 that functions as first metallization level and enables the electrical connection of the various contacts is disposed on the upper side of the planarizing closure layer 5 that can potentially be covered by a further layer. Additionally, a doped region 12 having a highly doped terminal region 13 adjacent thereto and on which a contact 14 is applied is located in the substrate 1 below the sensor region 8 in FIG. 1. This doped region 12 can be employed as a cooperating electrode for the electrically conductive sensor layer 3. A combined temperature/pressure sensor is obtained in this way if the sensor layer 3 and the closure layer 5 are fashioned so elastic (for example, adequately thin) in the sensor region 8 that, given a change in the external pressure, the distance between the sensor layer 3 and the doped region 12 in the sensor region 8 changes such that a change in the electrical capacitance between the sensor layer 3 and the doped region 12 can be registered and evaluated. In order to assure better mobility of the sensor webs 6 in the closure layer 5, this closure layer 5 can be etched thinner in the sensor region 8, as shown. The structured sensor layer 3 embedded into the closure layer 5 can likewise be provided for an actuator.

In the exemplary embodiment of FIG. 2, the sacrificial layer 2 with the cavity 4 produced therein and the structured sensor layer 3 thereon with the closure layer 5 are situated on the substrate 1. The closure layer 5 has a planar surface here on which the metallization 15 is applied. A portion of this metallization is located in structured form over the sensor webs 17. Here, the structuring of the metallization is composed, for example, of strip-shaped interconnects 16 and terminal pads 18 for electrical connection. The interconnects 16 are electrically conductively connected to one another and to the terminal pads 18 and are fashioned such that they act as heater elements when an operating current is applied. When the sensor layer 3 is polysilicon, it is advantageous to employ the sensor webs 17 as heater and the interconnects 16 as sensor because of the higher sheet resistivity of the polysilicon and the higher temperature coefficient for the electrical resistance of the metallic interconnects. The reversed operating mode, however, is also possible. The distance between heater and sensor is so slight that the sensor can identify a temperature change compared to a normal temperature set with the heater. The efficiency of the sensor can be improved with such a sensor/heater combination and, in particular, can be matched better to a specific temperature range on the basis of a suitable selection of the normal temperature. It is also fundamentally possible to arrange heater and sensor in the same layer plane or level of the sensor layer 3, for example meshed comb-like with one another, but electrically insulated from one another.

A schematic manufacturing process of an inventive sensor/actuator shall be set forth with reference to FIGS. 3 through 6. The layer-like structure of this sensor or, respectively, actuator is especially suited for being manufactured with the methods of surface micromachining within a standardized CMOS/BiCMOS process. Surface micromachining is a method for manufacturing micromechanical structures on the surface of a chip, especially a silicon chip, upon employment of what are referred to as sacrificial layers, that is, layers that only serve the purpose of structuring and are entirely or partially removed during the course of the process. In cross-section, FIG. 3 shows a substrate 1 with doped regions implanted therein for the manufacture of MOS transistors. These transistor regions are only entered for the sake of illustrating the common integration of drive elements and sensor. Fundamentally, arbitrary electronic components can be monolithically integrated in the substrate 1. The sacrificial layer 2 of, for example, an oxide is applied surface-wide on the upper side. This sacrificial layer 2 is respectively opened down onto the substrate over the doped regions (what are referred to as n-well and p-well) for the transistors.

The gate oxide and gate electrodes 9, for example of polysilicon, are applied in these openings in the sacrificial layer 2, and implantations for highly doped regions for source and drain are introduced. The manufacture ensues with standard process steps of a CMOS or BiCMOS process. A layer structured for the function as sensor or, respectively, actuator is produced on the upper side of the sacrificial layer 2 in the region provided for the sensor or, respectively, actuator, this layer being composed in this example of a sensor layer 3 of, for example, polysilicon structured with sensor webs 6 and being advantageously manufactured in the same process steps together with the gate electrodes. The sensor webs 6 are connected to one another and, for example, form a comb-like structure of polysilicon tracks that proceed meander-like and are arranged essentially parallel to one another. These tracks or strips, which are shown in cross-section in FIG. 3 as polysilicon webs 6, form interconnects with temperature-dependent electrical resistance. The cross-connections of the sensor webs 6 that are present in the direction of view have been omitted in FIG. 3 for the sake of clarity. Given employment of this structure as sensor, the temperature-dependent change of a current that has been applied and flows through the polysilicon webs is measured. Given employment of the structure as actuator (heater), a current that heats these interconnects of polysilicon is applied, so that the actuator works as a resistance heater. Instead of these polysilicon webs, for example, webs of metallization (for example, AlSiCu or Wo, potentially with diffusion barrier of Ti/TiN), aluminum-polysilicon thermocouples, polysilicon-polysilicon thermocouples, diodes or transistors (as heaters or sensors) in polysilicon or a combination of these components in a structured layer can be present.

After this structured layer has been manufactured, that is, after the sensor layer 3 of polysilicon has been structured with sensor webs 6 in this exemplary embodiment, the sacrificial layer 2 is removed selectively relative to the material (for example, silicon) of the substrate 1 in the region provided for the sensor/actuator, being removed with the assistance of an etching mask (for example, resist or silicon nitride) and an isotropic etchant (for example, HF or HF vapor). The region that is etched out is dimensioned such that ends of the sensor webs 6 (for example, the meander curves) rest on the remaining portions of the sacrificial layer 2. A recess provided for the cavity 4 is now located under the sensor layer 3 where the sacrificial layer is etched off (see FIG. 4).

Figure 5:
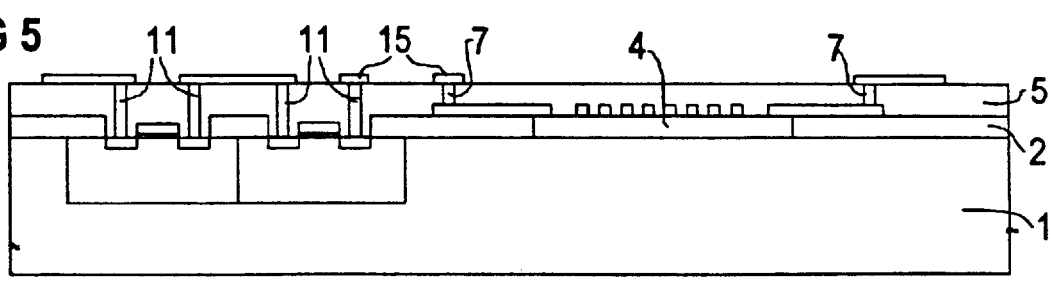

As shown in FIG. 5, the upper side is then covered surface-wide with a closure layer 5 of, for example, an oxide and is planarized. As warranted, a layer of various layer portions or a separate planarization layer can be additionally provided on the upper side. The closure layer can, for example, be borophosphorous silicate glass that is deposited with APCVD and that is subsequently allowed to flow by RTP tempering. The interspaces between the portions of the sensor layer 3 in the region of the sensor are thereby closed gas-tight. The cavity 4 in which an extremely low gas pressure prevails because of the deposition at low pressure and the possible reaction of gas residues with the silicon remains under the closure layer in the sensor region. This cavity therefore has an extremely low thermal conductivity and therefore thermally insulates the sensor/actuator layer very well from the material of the substrate 1. The interspaces between the sensor webs are selected adequately small in order to make sure that the cavity is not also filled with the material of the closure layer 5 when the closure layer 5 is deposited. As warranted, the material of the closure layer 5 can also be obliquely deposited, so that these interspaces between the sensor webs are at least partially occluded by the sensor webs. For this purpose, the spacing between the sensor webs should not amount to more than approximately 2 $\mu$m. It can be assumed in general that the width of the interspaces in the structured layer provided for the sensor or, respectively, actuator should not amount to more than 2 $\mu$m anywhere in each direction proceeding in the plane of this layer. For the electrical connections, openings are etched in the closure layer 5 and are filled with metal. A metallization 15 can also be applied onto the surface as first metallization level and, as warranted, further metallization levels separated from one another with dielectric layers can be applied. Alternatively, the closure layer 5 can be deposited as plasma oxide or plasma nitride with following SOG. Various process modifications for different materials employed are recited in the following Table by way of example.

| Oxide | Deposition | Pressure | Temperature | Use for: |
|---|---|---|---|---|
| BPSG | APCVD, low conformity, then flowing by RTP tempering: completely closed | atmospheric<br><br>low pressure: a few 10 mbar | ca. 430° C.<br><br>ca. 1100° C. 10 sec. | PolySi, tungsten<br><br>PolySi, tungsten |
| Plasma oxide<br>Plasma nitride | from plasma, directed, potentially oblique, completely closed | low pressure: a few 10 mbar | ca. 350° C. | PolySi, AlSiCu, tungsten |
| TEOS | LPCVD, conformal, completely closed | low pressure: a few 10 mbar | ca. 730° C. | PolySi, tungsten |
| Ozone-TEOS | LPCVD, conformal, completely closed | low pressure: a few 10 mbar | ca. 300° C. | PolySi, tungsten, AlSiCu |

Figure 6:
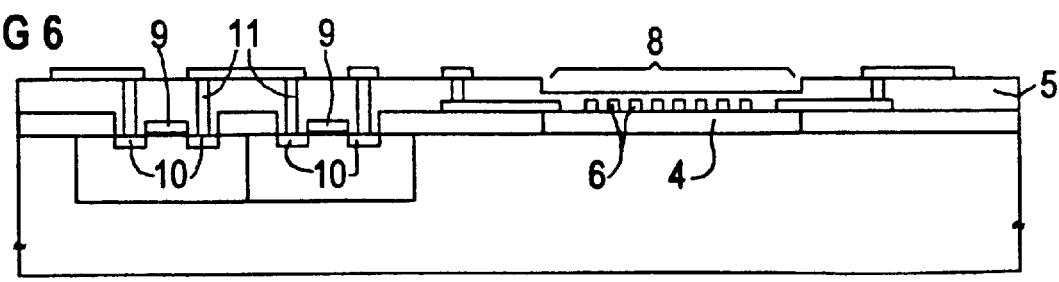

FIG. 6 shows the finished semiconductor component, the closure layer 5 was thinned in the sensor region 8 with a re-etching step (for example, dry etching) after the conclusion of the standard processing for the electrical connection. As a result thereof, the heat capacity and, thus, the response time of the sensor/actuator are reduced and the effectiveness of the thermal insulation relative to the substrate effected by the cavity 4 is further improved. Thermal sensors or, respectively, actuators can be monolithically integrated with electronic components or circuits in this way, every sensor/ actuator is thermally and electrically insulated from the semiconductor material of the substrate and other integrated components and is protected from contamination from the environment by a covering protective layer and also has a largely planar surface. For manufacture, the CMOS or BiCMOS standard process must merely be expanded by an additional mask and one or two additional etching steps.

A metallization (for example, AlSiCu or Wo, potentially with Ti/TiN barrier) instead of polysilicon can be provided for the sensor layer in alternative embodiments of this inventive component. In particular, the sensor webs 17 in the embodiment of FIG. 2 can also be formed by a metallization. When the surface of the sensor is provided with a radiation-absorbing layer, then a thermal radiation sensor is obtained.

FIG. 7 shows an exemplary embodiment of the inventive semiconductor component as a mass flow sensor in plan view. The electronic circuit 19, which serves the purposes of driving the sensors and evaluating the measured signals, is schematically indicated here by the rectangularly bordered region. A heater 20 is located in the sensor-actuator region, this heater 20 being arranged adjacent to a first sensor 21. A second sensor 22, a third sensor 23, a fourth sensor 24 and a fifth sensor 25 are arranged round about the heater 20 at a greater distance therefrom. The covered contours of the cavities that thermally insulate these sensors from the substrate are entered with broken lines. Given this array of sensors, the first sensor 21 measures the temperature decrease of the heater 20 dependent on the mass flow and thus determines the amount of the mass flow. The direction of the flow can be determined with the other four sensors 22, 23, 24, 25. The electronic circuit 19, which is monolithically integrated, comprising measuring and drive circuits, supplies the required operating currents and evaluates the measured signals coming from the five sensors. Instead of setting a normal temperature with the heater 20, the changes thereto given mass flow being acquired by the first sensor, the heater, for example, can be set to a constant temperature with a current regulating circuit. This predetermined, constant temperature is monitored by the first sensor and, given a change, the strength of current for the heater 20 is readjusted such that this temperature change is compensated. The mass flow can then be indirectly determined from the required change in the strength of current. If one forgoes calculating the flow direction, then the combination of heater 20 and first sensor 21 by itself is a simplified embodiment of this mass flow sensor.

The invention is not limited to the particular details of the method and apparatus depicted and other modifications and applications are contemplated. Certain other changes may be made in the above described method and apparatus without departing from the true spirit and scope of the invention herein involved. It is intended, therefore, that the subject matter in the above depiction shall be interpreted as illustrative and not in a limiting sense.

What is claimed is:

1. A method for the manufacture of a thermal sensor/actuator semiconductor, comprising the steps of:

in a first step, producing a structure of semiconductor material on a substrate of semiconductor material;

in a second step, producing a structured layer from an electrically conductive material provided for a sensor/actuator such that the structured layer is interrupted in a layer plane of the structured layer by interspaces and is structured to form webs that have a comb-like structure of polysilicon tracks that proceed meander-like and that are arranged substantially parallel to one another;

in a third step, producing a recess under the structured layer using said interspaces;

in a fourth step, depositing a closure layer, that seals said interspaces such that a cavity is formed in said recess, at a gas pressure that is a function of the cavity to be produced; and in a fifth step, producing contacts for electrical connection of the sensor/actuator.

2. The method according to claim 1, wherein BPSG (Boron Phosphor Silicate Glass) is deposited as the closure layer.

3. The method according to claim 1, wherein plasma oxide is deposited as the closure layer.

4. The method according to claim 1, wherein plasma nitride is deposited as the closure layer.

5. The method according to claim 1, wherein TEOS (tetraethylorthosilicate) is deposited as the closure layer.

6. The method according to claim 1, wherein the polysilicon webs are at least one of webs of metallization aluminum-polysilicon thermocouples, polysilicon-polysilicon thermocouples, and diodes or transistors in polysilicon.

* * * * *